United States Patent
Wee et al.

[19]

[11] Patent Number: 5,814,556
[45] Date of Patent: Sep. 29, 1998

[54] METHOD OF FILLING A CONTACT HOLE IN A SEMICONDUCTOR SUBSTRATE WITH A METAL

[75] Inventors: Young-jin Wee; In-seon Park, both of Seoul; Sang-in Lee, Suwon, all of Rep. of Korea

[73] Assignee: Samsung Electronics Co., Ltd., Suwon, Rep. of Korea

[21] Appl. No.: 698,372

[22] Filed: Aug. 15, 1996

[30] Foreign Application Priority Data

Aug. 18, 1995 [KR] Rep. of Korea .................. 1995 25458

[51] Int. Cl.$^6$ .............................................. H01L 21/4763
[52] U.S. Cl. .......................... 438/620; 438/667; 438/660; 438/643; 438/646; 438/688
[58] Field of Search ...................... 437/197, 24; 438/620, 438/667, 660, 735, 738, 643, 646, 648, 688

[56] References Cited

U.S. PATENT DOCUMENTS

| | | | |
|---|---|---|---|
| 4,788,082 | 11/1988 | Schmitt | 427/248.1 |
| 4,888,087 | 12/1989 | Moslehi et al. | 438/620 |
| 4,897,709 | 1/1990 | Yokoyama et al. | |
| 4,970,176 | 11/1990 | Tracy et al. | |
| 5,260,169 | 11/1993 | Nakano | 438/667 |
| 5,545,573 | 8/1996 | Narazaki et al. | 438/620 |
| 5,591,486 | 1/1997 | Okano et al. | 427/255.2 |
| 5,599,744 | 2/1997 | Koh et al. | 438/667 |
| 5,643,832 | 7/1997 | Kim | 438/620 |
| 5,665,630 | 9/1997 | Ishizuka et al. | 438/620 |

FOREIGN PATENT DOCUMENTS

| | | |
|---|---|---|
| 0 387 835 A2 | 9/1990 | European Pat. Off. |
| 61-183942 | 8/1986 | Japan . |
| 62-109341 | 5/1987 | Japan . |
| 62-132848 | 6/1987 | Japan . |
| 63-97762 | 4/1988 | Japan . |
| 63-99549 | 4/1988 | Japan . |

*Primary Examiner*—Charles L. Bowers, Jr.
*Assistant Examiner*—Lynne A. Gurley
*Attorney, Agent, or Firm*—Jones & Volentine, L.L.P.

[57] ABSTRACT

A method for forming a metal layer of an ultra-thin film according to metal deposition conditions and a method for forming metal wiring by filling a high aspect-ratio contact hole using cooling step prior to depositing the metal layer. In particular, the additional cooling process is performed before the process of depositing the metal layer and then the deposition process is performed in a state where the temperature of the wafer has been cooled down to a temperature in the range between −25° C. and room temperature. The surface morphology of the deposited metal layer is improved and a continuous ultra-thin film can be obtained. Also, the aluminum filling characteristics in the contact hole having a high aspect-ratio are improved.

5 Claims, 4 Drawing Sheets

METHOD OF FILLING A CONTACT HOLE IN A SEMICONDUCTOR SUBSTRATE WITH A METAL

BACKGROUND OF THE INVENTION

The present invention relates to a method for manufacturing a semiconductor device. More particularly it relates to a method for forming a metal layer with an ultra-thin film by utilizing conditions suitable for metal deposition and to a method for forming metal wiring by filling a high aspect-ratio contact hole using the same.

In a conventional semiconductor device of low density, the step-coverage of metal has not been much of a problem. However, the recent demands for high density semiconductor devices have exceeded the pace of advances in the technology required for such high-density semiconductor devices. For example, in such a high-density semiconductor device the diameter of a contact hole becomes very small (perhaps about a half-micron in diameter) and an area for impurity implantation which is to be formed in a semiconductor substrate becomes very shallow.

Techniques for forming wiring, by introducing metal into the contact hole of the semiconductor device to fill it, have included aluminum (Al)-reflow, high temperature sputtering and using a high-energy laser. Among them, the Al-reflow process has the advantages of being a process which is simplified and suitable for mass production.

However, there have been problems and imperfections in such a manufacturing process. They include a high aspect-ratio and the forming of voids where wiring should have been placed due to an inferiority in the step-coverage of the sputtered aluminum. Hence, various methods for filling the contact hole by melting aluminum have been disclosed as attempts to solve the above-mentioned problems.

For example, in Japanese laid-open Patent Nos. 62-132848, 63-99549 and 62-109341, the contact hole is filled by fluid aluminum which is formed by heating aluminum or aluminum alloy beyond the melting point after depositing the same. Such a method still has manufacturing problems. For example, it requires the semiconductor wafer to be positioned horizontally and level in order to fill the contact hole adequately with the melted fluid aluminum and it is difficult to maintain such positioning. Also, at times the fluid metal layer becomes shrunk or twisted in maturing due to a reduced surface tension which can cause exposure of a semiconductor substance in the lower portion. Therefore, mass production becomes more difficult since it is hard to maintain the temperature accurately adjusted for the heat treatment step so that such maturation problems are avoided.

Further, the remaining portion of the metal (the part of the surface other than the contact hole) becomes rough, which makes it is hard to apply a photolithography process to the surface in a subsequent step.

U.S. Pat. No. 4,970,176 discloses a method for forming metal wiring which is intended to improve step-coverage. In that method, a thick metal layer of a predetermined thickness is deposited at a temperature below about 200° C. and after the metal is deposited the temperature is allowed to increase up to about 400°–500° C. Depositing a metal layer in such a manner improves the step-coverage of the metal layer to be deposited thereafter since it permits particle growth, re-crystallization and bulk diffusion.

In another process, Ono, et al. have proposed a method for filling of the contact hole by depositing an Al—Si film at 500°–550° C. They have contended that the fluidity of Al—Si abruptly increases when the temperature of the Al—Si film is greater than or equal to 500° C. (Hisako Ono, et al. Development of a Planarized Al—Si Contact Filing Technology, in Proc., 1990 VMIC Conference June 12–13, pp. 76–82).

Also, Yoda, et al., have proposed a method for filling the contact hole by depositing metal at 500°–550° C. (E. P. patent application laid-open No. 0387835 and Japanese patent application No. 89-61557). According to such a method, the contact hole can be completely filled with metal. However, the Al—Si film has been shown to have the problems of an intensive resistance to electron migration and a weak resistance to stress. Another reason that the above method is not preferable is due to the fact that the Si included in Al—SI film is precipitated at a boundary between Al particles. Thus, after all of the Al—Si film other than in the contact hole has been removed, an additional step is required to form wiring thereon by depositing an Al—Si—Cu film.

Others (C. S. Park, et al.), including the present inventor, have proposed a method for completely filling the contact hole by depositing an aluminum alloy at a low temperature of about 100° C. (or below) and then applying a heat treatment for about 3 minutes at about 550° C., which is a temperature below the melting point of the aluminum alloy (Proc., 1991 VMIC Conference June 11 and 12 pp. 326–328). The aluminum deposited at such a low temperature is not permitted to completely melt during the heat-treatment process at 550° C. Instead, the bonds between the aluminum atoms are relaxed enough to soften the aluminum and permit it to flow into the contact hole which thus completely fills the contact hole.

According to the method by C. S. Park, et al., the heat treatment after depositing of an aluminum layer of about 500 Å thickness at a low temperature of 100° C. (or below) can permit a contact hole, of which size and aspect ratio are 0.8 µm and about 1.0, respectively, to be completely filled. Also, this method has the advantage of not requiring an etching step such as is necessary in the Yoda et al.'s method. Due to such advantages, this contact-hole-filling method by C. S. Park, et al., has aroused considerable interest in the relevant field.

Further, the metal wiring layer is formed by utilizing pure aluminum in an early stage of manufacturing a semiconductor. However, as temperature rises in a sintering step, the aluminum layer absorbs silicon atoms from a silicon substrate and generates junction spiking. Accordingly, Al—1% Si which is made by supersaturating aluminum with silicon has been widely used as a material for the metal wiring layer.

In spite of such widespread use, forming the wiring of a semiconductor device by using such Al—1% Si still requires the silicon in the Al film to be extracted to form an Si-dust in a heat-processing step at a temperature of about 450° C. or more. This leads to an increase in the contact resistance of the wiring which is obtained.

However, there is a corrective step known to the ordinary practitioner in this field which is utilized to address the above problems. Corrective steps include forming a diffusion prevention film in between the wiring layer and the silicon substrate. This provides an insulation film to prevent the formation of the Al spiking or Si-dust from the above reaction between the metal wiring layer and silicon substrate.

For example, U.S. Pat. No. 4,897,709 discloses a method of forming a titanium nitride film as the diffusion prevention film on an inner barrier of the contact hole. Also, Japanese patent laid-open No. 61-183942 discloses a method to improve a barrier effect by applying a heat-treatment step after forming a double layer comprising a refractory metal layer and a titanium nitride film as a barrier layer. This causes the formation of a refractory metal silicide layer of a stable thermal compound at the lower portion of the contact hole contacting the semiconductor substrate.

Also, Nishita, et al., have proposed a method to increase the barrier effect by forming a TiN layer, heat-treating the same and forming a TiN layer again when forming the diffusion barrier layer (Japanese patent laid-open No. 63-97762).

It is preferable that an oxide exists on a surface of the diffusion prevention film and boundaries between particles to enhance the characteristic of the diffusion-prevention film in the contact hole where the diffusion prevention film is formed. However, the existence of such an oxide lowers the wettability between the diffusion prevention film and aluminum. Such lowering can cause the formation of voids, or lead to a metal layer having an inferior profile in the heat-treatment process. This has the effect of lowering the reliability of the wiring layer of the semiconductor device.

Dipankar, et al., have announced an experimental result of depositing Al—1% Cu alloy on various underlayers at 170° C. in a paper entitled "Effect of Underlayer on Sputtered Aluminum Grain Structure and its correlation with Step Coverage in Submicron VIAS" by Dipankar Pramanik and Vvek Jain, Jun. 12–13, 1990 VMIC conference, pp. 332–334. Dipankar, et al., teach that depending upon the kinds of underlayers present the sizes of aluminum particles generated in the deposition are different from each other. They also teach that the step coverage of aluminum correlates to the sizes of aluminum particles generated in the deposition.

From the above-described technical background, it can be seem that the degree of success for the Al-reflow process in filling the high aspect-ratio contact hole in the Al deposition step is determined by process factors such as the wettability between the Al metal layer and its underlayer (that is the barrier metal) and the reactions between them.

For instance, voids are generated in the following heat-treatment process from points where there is the smallest degree of wettability between Al and its underlayer. Also, using an underlayer which reacts with Al makes it difficult to continuously fill the contact hole since the reaction layer generated at their interface restrains the mobility of Al.

SUMMARY OF THE INVENTION

To solve the above problems, it is an object of the present invention to provide a method of forming a metal layer in a semiconductor device which improves the deposition conditions in depositing the metal layer, such that the metal layer is reliably formed to result in a continuous thin film.

It is another object of the present invention to provide a method of forming wiring in a semiconductor device by utilizing the metal layer of the above continuous thin film, by which a contact hole can be consistently filled with a high aspect ratio.

Accordingly, to achieve the first object, the present invention provides a method for forming a continuous thin film metal layer by physical vapor deposition of a metal, wherein a metal is deposited after the temperature of a wafer is lowered by a cooling process by which the wafer is forcibly cooled down to provide for the dense nucleation of atoms which are introduced with a predetermined amount of energy and become physically attached to a predetermined position on the wafer.

The preferred temperature of the wafer when the metal atoms are deposited is between −25° C. and the room temperature. Also, a preferred metal layer is a layer which utilizes a metallic substance comprising atoms selected from the group consisting of Al, Cu, Ag, Au and W, each of which is adapted to be a composition suitable to be used as a wiring material.

According to one embodiment of the present invention, a contact-type cooling method is used in the forced cooling process, by which the temperature of the wafer falls down to a range between −25° C. and the room temperature. The contact-type cooling utilizes a cooler installed at the rear side of the wafer, said cooler having a coolant therein which circulates. The coolant may be a member selected from the group consisting of liquid nitrogen, He, cooling water, and the like.

According to the other embodiment of the present invention, a non-contact-type rear gas conduction method is used for the forced cooling process. Therein, a reduction gas such as $H_2$ which prevents metal from oxidation, or inert-gas such as He is used as a conduction gas for the cooling effect.

To achieve the second object, there is provided a method for forming the wiring of a semiconductor device comprising the steps of:

(a) forming an interlayer insulation layer on a semiconductor substrate;

(b) forming a contact hole which extends onto a surface of the semiconductor substrate through the interlayer insulation layer;

(c) depositing a diffusion prevention film on a surface of the bottom of the contact hole;

(d) depositing a continuous thin film of aluminum or aluminum alloy on the diffusion prevention film at a deposition temperature of between −25° C. and the room temperature; and (e) filling the contact hole by heat-treating the thin film of the aluminum or aluminum alloy at a temperature less than or equal to the melting point of the thin film.

DETAILED DESCRIPTION OF THE INVENTION

The above objects and advantages of the present invention will become more apparent by the detailed description below of a preferred embodiment with reference to the accompanying drawings.

When a physical deposition of a metal atom on the semiconductor device surface is practiced, the metal atom being deposited is usually input at a certain energy level. Therefore, the physically attached atom (called an "adatom") has a tendency to migrate somewhat from the input position and then to be deposited while the atoms are re-arrayed on the surface. In such a process atoms are condensed toward the surface of a substrate as they lose energy and begin forming stable nuclei. The extent of nucleation changes depends upon the degree of mobility, which, in turn, depends upon the interaction between the adatom and a surface of the substrate or underlayer and also upon the kinetic energy of the adatom.

In developing the present invention, the characteristics of metal atom behavior in Al-reflow process for a sub-half micron contact having a high aspect-ratio have been carefully studied. It has been observed that a metal atom behavior varies according to the various metal-depositing conditions. Particularly observed were behavior changes of atoms regarding characteristics such as wettability, i.e., the probability of attachment of sputtered metal atoms, so called "adatom," to the underlayer, nucleation and grain size. Such factors are important in determining the reliability of wiring.

The initial deposition characteristics of a metal thin film were investigated by experiments as described below.

Figure 1:
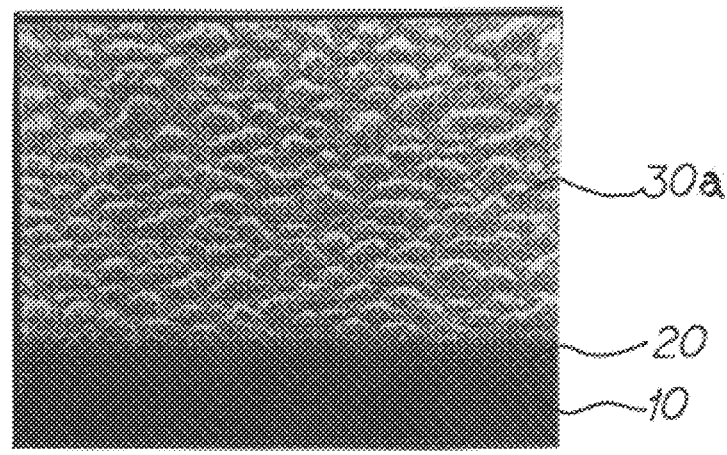
FIG. 1 is a photo showing the deposition characteristics of an aluminum film which was deposited on a diffusion prevention film by utilizing a common high-temperature deposition method.
Figure 2:
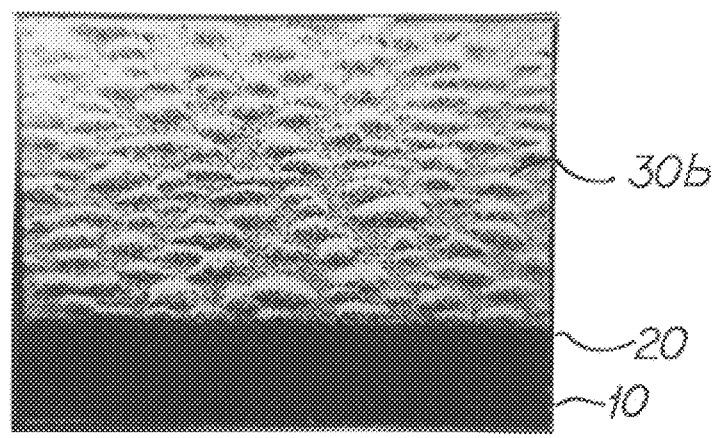
FIG. 2 is a photo showing the deposition characteristics of an aluminum thin film which was deposited at a low temperature but without utilizing a cooling process such as utilized in the present invention.
Figure 3:
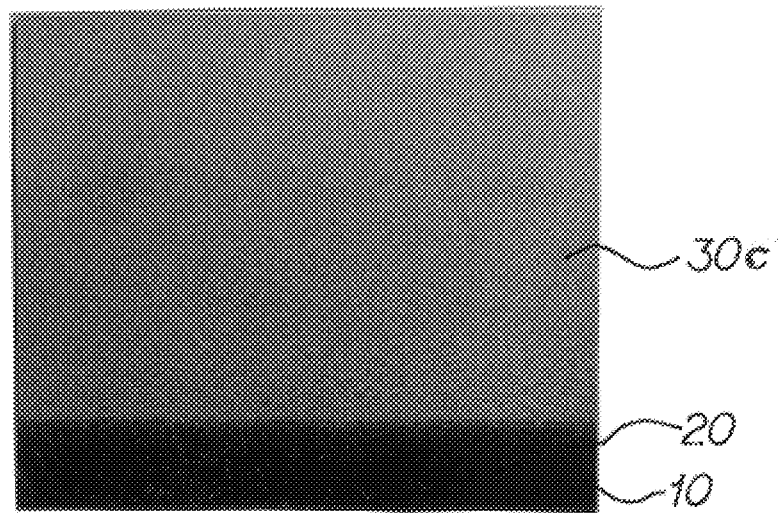
FIG. 3 is a photo showing the deposition characteristics of Al which was deposited as a thin continuous film under conditions which utilized the cooling process according to the present invention.

FIGS. 1–3 are SEM photos showing sectional views of the nucleation deposition characteristics of Al on a TiN underlayer. The SEM photo views show characteristic deposition patterns which vary depending upon the conditions under which the aluminum metal layer was deposited.

FIG. 1 shows a conventional surface morphology of an Al film 30a which had been deposited at a high temperature of about 450° C. FIG. 2 shows a conventional surface morphology of an Al film 30b which had been deposited at a low temperature of about 20° C., but without utilizing a cooling process according to the present invention. FIG. 3 shows a surface morphology of an Al film 30c which was applied while utilizing a cooling process according to the invention.

In the following description of the present invention, the descriptions of elements which utilize the same reference numerals in the accompanying drawings will be omitted.

Silicon is employed as a substrate 10 upon which is deposited an underlayer 20 TiN having a thickness of 600 Å under the conditions of a temperature of 200° C., the pressure of 2 m Torr and the ratio of Ar:$N_2$=40:85. Al films 30a, 30b and 30c were formed by depositing an ultra-thin film of 60 Å.

After the Al thin film was deposited by utilizing a usual method which does not apply an additional cooling process, the continuity of the film in Al's initial nucleation was investigated. The result is that in the film there appears islands 30a and 30b as shown in the section-viewing photos of FIGS. 1 and 2.

Accordingly, it can be seen that the Al deposited on a wafer is formed in the shape of islands as a deposition temperature rises. But, a continuous film is obtained when Al is deposited after the temperature of the wafer is lowered by intentionally cooling it down. This is because the mobility of the Al adatom is reduced and consequently the migration of Al atoms becomes less by applying the cooling process when the Al adatom is being attached onto underlayer 20 in a heated state due to the occurrence of sputtering.

Further, as observed in FIG. 3, a very dense continuous film is obtained by depositing aluminum alloy 30c, such as Al or Al—1% Si—0.5% Cu, to the thickness of 60 Å and by keeping the temperature of wafer 10 at temperatures between −25° C. and the room temperature. Further, by utilizing such procedures it is also possible to get an ultra-thin film with a 20 Å thickness.

In addition to utilizing Al or an aluminum alloy, the above metal layer can be formed by utilizing a metallic substance comprising atoms selected from the group consisting of Cu, Ag, Au, W. etc., each of which is adapted to have a good electric conductivity such that they may serve as wiring materials.

In the preferred embodiment of the present invention, the following two methods are employed to provide the above cooling process.

One method for lowering the deposition temperature is a non-contact-type method by which the wafer is forcibly cooled down by being exposed to flowing room temperature Ar gas within the same chamber for a predetermined time necessary to deposit the aluminum layer.

Specifically, in this method, a non-contact-type gas conduction method is used on the rear of the wafer to effectively cool the temperature of the wafer down. In addition to using argon for a conduction gas, a reduction gas such as $H_2$, which prevents metal from oxidizing, or an inert-gas such as He may be used.

The temperature of a wafer at the chuck when TiN is being deposited is about 200° C. As the wafer, which is hot due to the effect of a plasma atmosphere within the chamber, is cooled down by the Ar gas of the room temperature, the mobility of Al atoms becomes restricted such that a continuous Al film is formed.

However, when the cooling process uses the same chamber as that utilized in the metal depositing process, there is a problem due to a build-up of heat in the wafer chuck and a consequent transfer of heat to the wafer. The temperature of the wafer chuck tends to continuously rise since the wafer is kept in a plasma atmosphere for such a long time. However, if another chamber is used to execute the cooling process prior to the Al deposition step, the rise of the chuck's temperature can be controlled because the cooling process is not a subsequent process to the Al deposition process. Moreover, by utilizing two different chambers and making them separate procedures, the continuity of the deposited Al film can be improved.

In another method a contact-type cooling method is employed, which intentionally cools the wafer's temperature down to temperatures ranging between −25° C. and the room temperature. Such a method is implemented by installing a cooling unit at the rear side of the wafer, in which a coolant circulates, i.e., installing an additional chiller block outside of the deposition chamber.

If the wafer is cooled down within the same chamber by utilizing such a cooling unit and then the deposition process of Al is executed in a continuous process thereafter, a more dense Al nucleation can be obtained than that in the above-described first cooling method utilizing Ar gas.

In such a contact-type cooling process, liquid nitrogen, He gas, cooling water, or the like can be used as the coolant.

The following descriptions are for a method of forming a wiring layer at a high aspect-ratio contact hole by using the optimum metal-layer forming method according to the above-described procedures.

Figure 4:
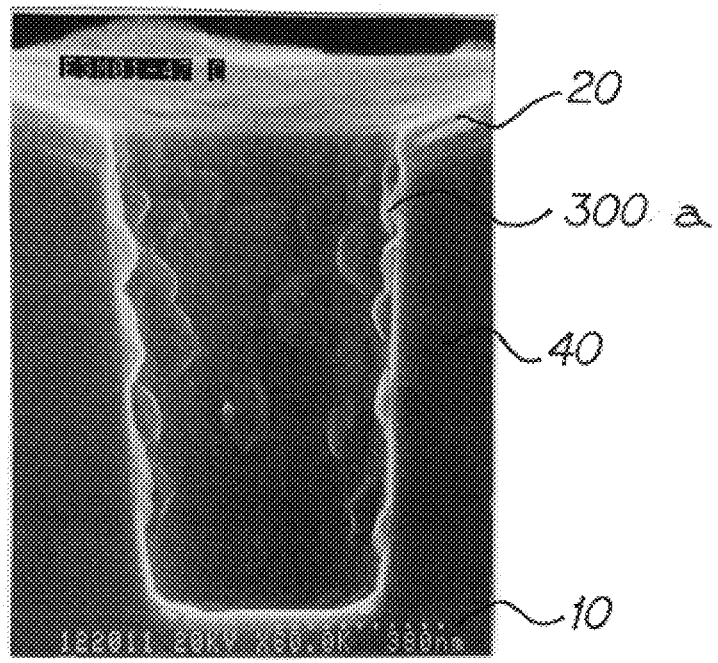
FIG. 4 is a section-viewing scanning electron micrograph ("SEM") photo of a contact hole wherein Al has been deposited on a TiN underlayer without cooling the wafer containing the contact hole.
Figure 5:
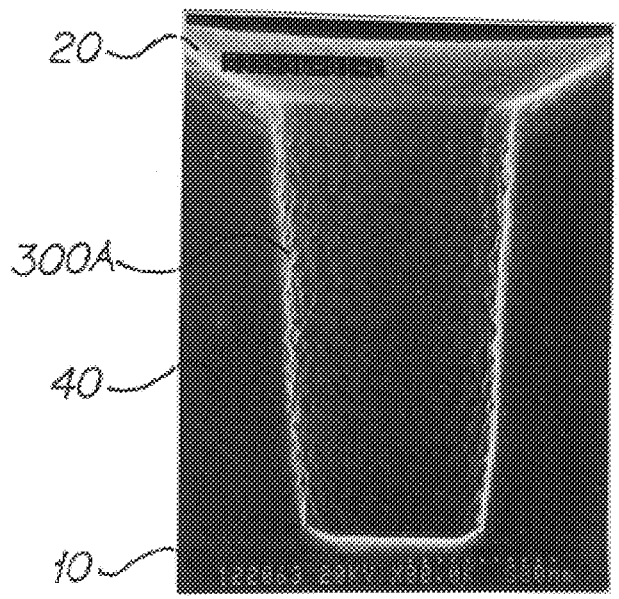
FIG. 5 is a section-viewing SEM photo of a contact hole wherein Al has been deposited on a TiN underlayer with the wafer being cooled according to the invention.

FIGS. 4 and 5 are photos showing the sectional views of the resultants which are obtained by depositing metal according to the existence of the cooling process on a substrate 10 being provided with a contact hole, an interlayer insulation film 40 and a TiN barrier layer 20.

The diameter and aspect ratio of the contact hole are 0.37 µm and 3, respectively. The deposition conditions of TiN film 20 and Al film 300a or 300A were the same conditions as described above, excepting that the deposition thickness of Al is about 600 Å. In the cooling process, room temperature Ar gas was circulated for 90 seconds in a different chamber from that wherein the Al deposition was executed.

As seen in the section-viewing photo of FIG. 4, the grain size of aluminum 300a deposited on TiN 20 is large and a site where aluminum is not deposited (a void) is observed on a part of a sidewall of the contact hole. However, as observed in the section-viewing photo of FIG. 5, fine Al-grain 300A is continuously deposited when the cooling process is performed and enhances the sidewall-coverage in the contact hole. Such an aspect is similar to Al-grain growth on the underlayer having no aspect-ratio.

Figure 6:
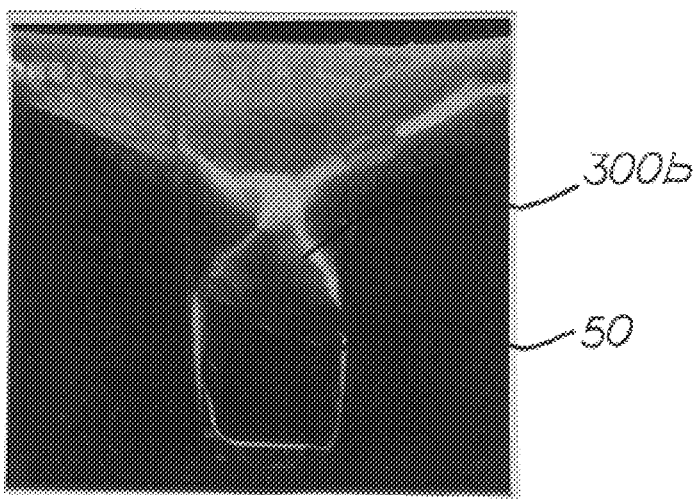
FIG. 6 is a section-viewing SEM photo of a contact hole wherein Al has been deposited after a reflow process without the wafer having been cooled.
Figure 7:
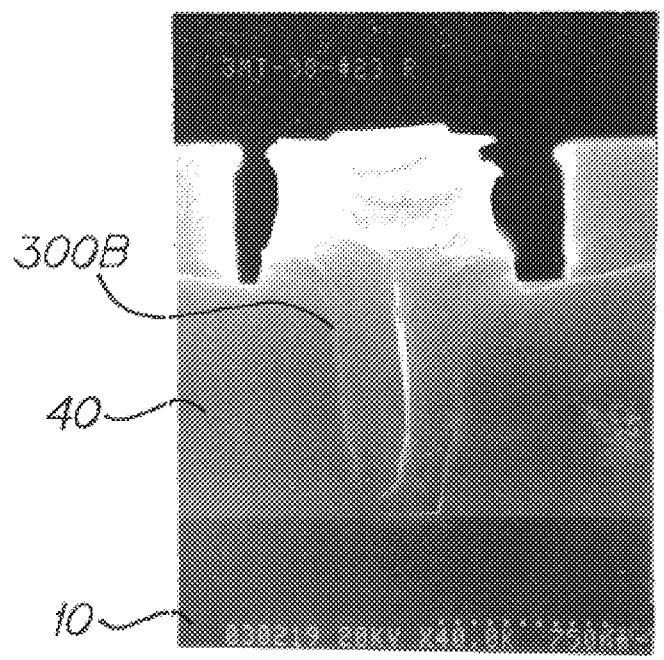
FIG. 7 is a section-viewing SEM photo of a contact hole wherein Al has been deposited after a reflow process with the wafer being cooled according to the invention.

FIGS. 6 and 7 show section-viewing photos observed by SEM which illustrate characteristics of contact filling after deposition of an aluminum or aluminum alloy to a thickness of about 6000 Å and an Al-reflow process corresponding to the absence and presence of the cooling process, respectively.

The heat-treatment process is performed at 580° C. for 90 seconds and the temperature of the wafer is about 450° C.

As shown in FIG. 6 of the above photos, when the reflow process was conducted without utilizing the cooling process, a void 50 is generated and the contact hole is not filled at a place of bad wettability.

By contrast, the mobility of aluminum atoms 300B is restricted when they are deposited at deposition temperatures in a range between –25° C. and the room temperature. This reduces the occurrence of the phenomenon of atoms holding together due to migration. Accordingly, the aluminum filling characteristic is improved (refer to FIG. 7).

To obtain a high aspect-ratio requires that a metal layer be continuously deposited at a sidewall and bottom of the contact hole for the filling of the high aspect-ratio contact hole and be heat treated. It is possible to obtain such a continuously deposited layer by fully cooling the temperature of the wafer down before depositing the metal. Namely, as the metal-depositing temperature rises, the mobility of the adatom increases and as the grain grows, the size of the grain becomes larger. However, in the case of a low temperature at deposition, a continuous metal layer is formed due to the decrease of migration of the adatom.

Hence, since the nucleation of the metal is improved by fully cooling the temperature of the wafer down before depositing aluminum, the continuous metal layer is formed. Thereby, an ultra-thin film of 30 Å is deposited.

As described above, in the present invention, the additional cooling process is performed before the deposition process of the metal layer. Subsequently, the deposition process is performed in a state where the temperature of the wafer has been cooled down to a range between –25° C. and the room temperature.

Accordingly, the wettability which indicates the degree of attachment of the sputtered adatom to the underlayer is improved and grain boundary energy per unit volume based on the increase of nucleation site number is increased. As a result, the surface morphology of the deposited metal layer is improved and the continuous ultra-thin film can be obtained. Also, the aluminum filling characteristics in the contact hole having a high aspect-ratio can be improved.

It is noted that the present invention is not limited to the preferred embodiment described above, since other modifications within the spirit and scope of the present invention will be apparent to those skill in this technology. Hence, the present invention includes variations and modifications which may be apparent to those skilled in the art and can be effected within the spirit and scope of the present invention as defined in the appended claims.

What is claimed is:

1. A method of filling a contact hole in a semiconductor substrate, comprising:
    (a) forming an interlayer insulation layer on the semiconductor substrate;
    (b) forming a contact hole through the interlayer insulation layer and into the semiconductor substrate;
    (c) depositing a diffusion prevention film on a bottom surface of the contact hole;
    (d) depositing a continuous film of aluminum or aluminum alloy on the diffusion prevention film at a deposition temperature in a range between –25° C. and room temperature; and
    (e) heat-treating the film of the aluminum or aluminum alloy at a temperature less than or equal to the melting point of the film of the aluminum or aluminum alloy.

2. A method as claimed in claim 1, wherein a contact-type cooling method is employed in said step of depositing the film of aluminum or aluminum alloy, by which cooling method the temperature of a semiconductor substrate is intentionally lowered down to a range between –25° C. and room temperature by using an additional cooling unit installed at a rear side of said semiconductor substrate, said cooling unit having a coolant circulating therein.

3. A method as claimed in claim 2, wherein said coolant is selected from the group consisting of liquid nitrogen, He and cooling water.

4. A method as claimed in claim 1, wherein a non-contact-type rear gas conduction method is used for lowering the deposition temperature in said step of depositing the film of aluminum or aluminum alloy.

5. A method as claimed in claim 4, wherein a reduction gas or an inert-gas is used as the conduction gas for cooling.

* * * * *